United States Patent
Chung et al.

(10) Patent No.: US 8,068,381 B2
(45) Date of Patent: Nov. 29, 2011

(54) CACHE MEMORY

(75) Inventors: Sung Woo Chung, Seoul (KR); Joon Ho Kong, Seoul (KR)

(73) Assignee: Korea University Research and Business Foundation (KR)

( * ) Notice: Subject to any disclaimer, the term of this patent is extended or adjusted under 35 U.S.C. 154(b) by 254 days.

(21) Appl. No.: 12/563,145

(22) Filed: Sep. 20, 2009

(65) Prior Publication Data

US 2010/0208541 A1    Aug. 19, 2010

(30) Foreign Application Priority Data

Feb. 17, 2009 (KR) .................. 10-2009-0013067

(51) Int. Cl.
*G11C 8/00* (2006.01)
(52) U.S. Cl. .................. 365/230.06; 365/189.05
(58) Field of Classification Search ............. 365/230.06, 365/189.05
See application file for complete search history.

(56) References Cited

U.S. PATENT DOCUMENTS 5,604,711 A    2/1997  Cheung
6,738,278 B2 *  5/2004  Kim et al. .................. 365/49.1

* cited by examiner

*Primary Examiner* — Son Dinh
*Assistant Examiner* — Nam Nguyen
(74) *Attorney, Agent, or Firm* — Robert Plotkin, P.C.

(57) ABSTRACT

Disclosed is a cache memory, and more particularly to a cache memory, in which a word-line voltage control logic unit and a word-line driver are added as a logic circuit between a row decoder and a word line, so that a reinforcement voltage signal having a higher level than a basic voltage signal can be applied when accessing the word line corresponding to an access time failure, thereby decreasing an access time delay in the word line in order to minimize an access failure to the cache memory due to process variation. The cache memory including: a row decoder which decodes and outputs an input address signal; a plurality of word-line voltage control logic units which output a basic voltage signal or a reinforcement voltage signal having a higher voltage level than the basic voltage signal according to whether or not word lines involve a cell having an access time failure; and word-line drivers which are one-to-one connected to output lines of the row decoder and supply the word lines with the basic voltage signal or the reinforcement voltage signal output from the word-line voltage control logic unit only if a signal output through the output line of the row decoder is an activation signal.

9 Claims, 2 Drawing Sheets

＃ CACHE MEMORY

CROSS-REFERENCE TO RELATED APPLICATION

This application claims the benefit of commonly-owned Korean Patent Application No. 10-2009-0013067, filed Feb. 17, 2009, entitled, "Cache Memory," the disclosure of which is hereby incorporated herein by reference in its entirety.

BACKGROUND OF THE INVENTION

1. Field of the Invention

The present invention relates to a cache memory, and more particularly to a cache memory, in which a word-line voltage control logic unit and a word-line driver are added as a logic circuit between a row decoder and a word line, so that a reinforcement voltage signal having a higher level than a basic voltage signal can be applied when accessing the word line corresponding to an access time failure, thereby decreasing an access time delay in the word line in order to minimize an access failure to the cache memory due to process variation.

2. Description of the Related Art

With development of semiconductor technologies, nano-scale technologies have been applied to a chip fabrication. As the size of a transistor used in a chip becomes smaller, a problem of process variation has been on the rise. As a problem that did not occur in a conventional large-scale chip, there is a little difference in characteristics (e.g., the length of an effective channel, the thickness of an oxide layer, etc.) among fabricated transistors.

Accordingly, in the case of a 6-transistors static random-access memory (6T SRAM) cell generally used in a cache memory, if six transistors are a little different in characteristics, two problems may arise. Specifically, it may be unpunctual in an access time and unable to read/write.

Such problems may cause the whole of a cache line having a defect to be unable, and bring a system failure in the case of a direct-mapped cache. In even the case of a set-associative cache, it is impossible to use all ways, thereby causing damage in performance.

In result, there is an unusable cache line owing to the foregoing defect, and thus a yield of the cache memory decreases. Particularly, an access failure due to the unpunctual access time is far more likely to occur than unstable reading/writing. In the case of an L1 cache, because the access has to be accomplished within one cycle, it is very important to consider the access failure in designing the access.

SUMMARY OF THE INVENTION

Accordingly, an aspect of the present invention is to provide a cache memory, in which a word-line voltage control logic unit and a word-line driver are added as a logic circuit between a low decoder and a word line, so that a reinforcement voltage signal having a higher level than a basic voltage signal can be applied when accessing the word line corresponding to an access time failure, thereby decreasing an access time delay in the word line in order to minimize an access failure to the cache memory due to process variation.

Additional aspects and advantages of the present invention will be set forth in part in the description which follows and, in part, will be obvious from the description, or may be learned by practice of the invention based on means from and combination of claims.

The foregoing and/or other aspects of the present invention may be achieved by providing a cache memory including: a row decoder which decodes and outputs an input address signal; a plurality of word-line voltage control logic units which output a basic voltage signal or a reinforcement voltage signal having a higher voltage level than the basic voltage signal according to whether or not word lines involve a cell having an access time failure; and word-line drivers which are one-to-one connected to output lines of the row decoder and supply the word lines with the basic voltage signal or the reinforcement voltage signal output from the word-line voltage control logic unit only if a signal output through the output line of the row decoder is an activation signal.

The word-line voltage control logic unit may include a gate driver which generates and outputs a high level voltage or a low level voltage according to whether or not the word lines involve the cell having the access time failure; a first switching transistor which includes a gate terminal connected to an output line of the gate driver, a drain terminal connected to a basic voltage source, and a source terminal connected to the word-line driver; and a second switching transistor which includes a gate terminal connected to the output line of the gate driver, to which a level voltage relevant to a level voltage input to the gate terminal of the first switching transistor is input, a drain terminal connected to a reinforcement voltage source, and a source terminal connected to the word-line driver.

The output line of the gate driver and the gate terminal of the first switching transistor may be connected to each other via an inverter, but the output line of the gate driver and the gate terminal of the second switching transistor may be directly connected to each other.

The output line of the gate driver and the gate terminal of the second switching transistor may be connected to each other via an inverter, but the output line of the gate driver and the gate terminal of the first switching transistor may be directly connected to each other.

The first switching transistor and the second switching transistor may include an n-channel metal oxide semiconductor (NMOS) or p-channel metal oxide semiconductor (PMOS) transistor.

The gate driver may previously store a bit value of "0" or "1" and generate and output a low or high level voltage having a level corresponding to the bit value.

The high level voltage may be input to the gate terminals of the first and second switching transistors and sufficient to turn on the first and second switching transistors.

The basic voltage source may generate a basic voltage signal within a range of 0.7V to 0.9V to be applied to the drain terminal of the first switching transistor, and the reinforcement voltage source may generate a reinforcement voltage signal within a range of 1V to 1.5V to be applied to the drain terminal of the second switching transistor.

The word-line driver may include a third switching transistor including a gate terminal to which a signal output through the output line of the row decoder is inverted and input, and a drain terminal connected to the source terminals of the first and second switching transistors; a fourth switching transistor including a gate terminal to which a signal output through the output line of the row decoder is input, a drain terminal connected to the source terminal of the third switching transistor, and a source terminal connected to a ground; a fifth switching transistor including a gate terminal to which a signal output through the source terminal of the third switching transistor and the drain terminal of the fourth switching transistor is inverted and input, a drain terminal connected to the source terminals of the first and second switching transistors, and a source terminal connected to the word line; and a sixth switching transistor including a gate terminal to which a signal output through the source terminal of the third switching transistor and the drain terminal of the fourth switching transistor is input, a drain terminal connected to the source terminal of the fifth switching transistor and the word line, and a source terminal connected to the ground.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE INVENTION

Below, a cache memory according to an exemplary embodiment of the present invention will be described with reference to accompanying drawings.

Figure 1:
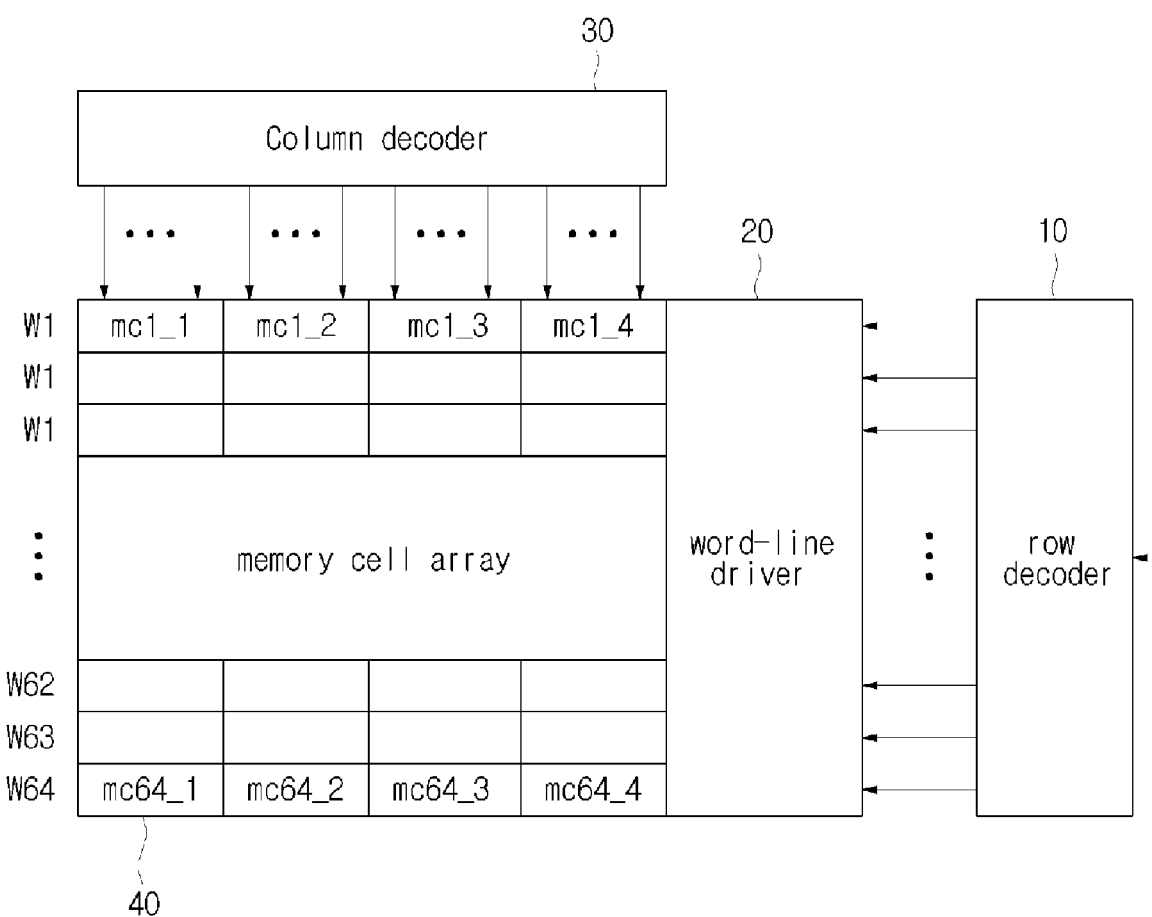
FIG. 1 is a schematic view of a general cache memory applied to an embodiment of the present invention.
Figure 2:
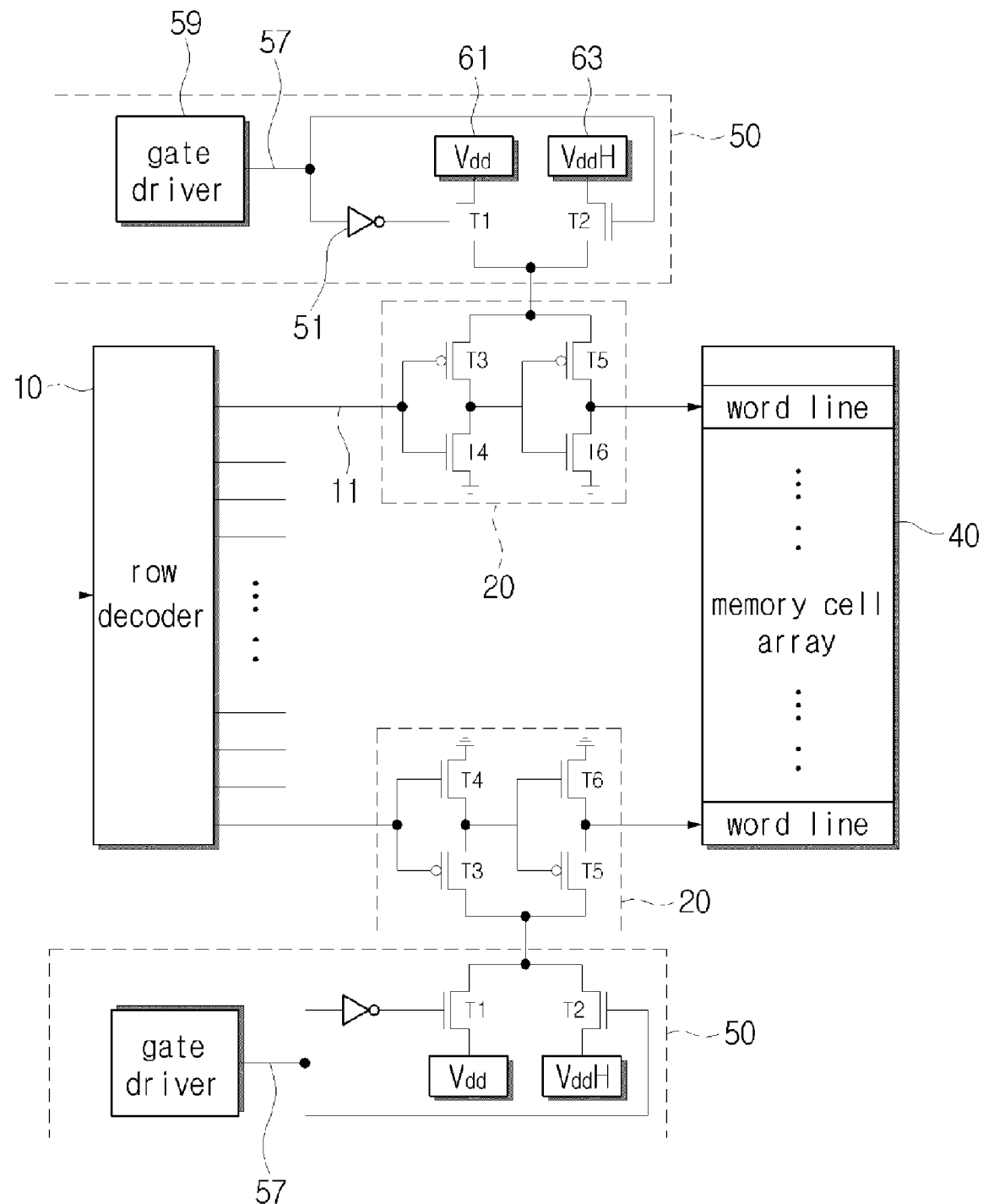
FIG. 2 is a schematic view of a modified cache memory applied to an embodiment of the present invention.

FIG. 1 is a schematic view of a general cache memory, and FIG. 2 is a schematic view of a modified cache memory applied to an embodiment of the present invention.

As shown therein, a general cache memory includes a row decoder 10, a word-line driver 20, a column decoder 30, and a memory cell array 40.

The row decoder 10 decodes and outputs a row address signal received from an external unit (not shown). The decoded signal is used in controlling the word-line driver 20. On the basis of the decoded signal, the word-line driver 20 activates some word lines included in the memory cell array 40. Meanwhile, the column decoder 30 decodes a received column address signal and enables corresponding bit lines.

The cache memory with these elements undergoes a test after fabricated. As a result of the test, there is a cell where an access time failure occurs due to process variation. Meanwhile, the whole line including this cell corresponding to the access time failure is unusable.

To use even the cache lines including the cell where the access time failure occurs, an embodiment of the present invention proposes that a plurality of word-line voltage control logic units 50 and a plurality of word-line drivers 10 are placed as a logic circuit between the row decoder and the word line of the memory cell array 40 as shown in FIG. 2.

The word-line voltage control logic unit 50 and the word-line driver 20 are placed between the row decoder 10 and the memory cell array 40 so as to quickly read data from the word lines (to which the cell where the access time failure occurs belongs) included in the memory cell array 40 to be accessed.

In other words, the word-line voltage control logic unit 50 and the word-line driver 20 are employed for preventing an access time delay in the word line to which the cell where the corresponding access time failure occurs belongs.

As shown in FIG. 2, the cache memory modified according to an embodiment of the present invention includes the row decoder 10, the plurality of word-line driver 20, the memory cell array 40, and the plurality of word-line voltage control logic units 50. Of course, it will be appreciated that other elements (column decoder, etc.) included in a general cache memory may be provided in addition to the foregoing elements.

The row decoder 10 decodes and outputs a received row address signal like a general cache memory. In a general cache memory, the decoded signal is directly input to the word-line driver 20 and controls the word-line driver 20 to supply the word line with a voltage having a certain level for activating the word-line.

On the other hand, in this embodiment, the output signal of the row decoder 10 is input to the word-line driver 20 and controls the word-line driver 20 to supply the word line with one of two voltages different in a level to activate the word line. In this case, the word-line driver 20 receives one of the two voltages having different levels from the word-line voltage control logic unit 50.

The word-line voltage control logic units 50 are placed between the output lines 11 of the row decoder 10 and the corresponding word lines, respectively. Thus, the number of word-line voltage control logic units 50 is equal to the number of output lines of the row decoder 10.

Each word-line voltage control logic unit 50 outputs a basic voltage signal or a reinforcement voltage signal having a higher level than the basic voltage signal according to whether or not each word line of the memory cell array 40 includes a cell where the access time failure occurs.

Here, the basic voltage signal has a voltage level enough to activate a word line that does not involve the cell where the access time failure occurs, i.e., to activate a normal word line. For example, the basic voltage signal indicates a threshold voltage of 0.7V~0.9V capable of turning on a normal transistor having no process variation. Also, the reinforcement voltage signal has a voltage level enough to activate a word line that involves the cell where the access time failure occurs. For example, the reinforcement voltage signal indicates a higher voltage of 1V~1.5V higher than the basic voltage signal.

In other words, the word-line voltage control logic unit 50 is configured to output the reinforcement voltage signal if the corresponding word line involves the cell where the access time failure occurs, but output the basic voltage signal if the corresponding word line does not involve the cell where the access time failure occurs.

For example, if the first word line involves the cell where the access time failure occurs, the word-line voltage control logic unit 50 (i.e., the first word-line voltage control logic unit 50 placed corresponding to the first word line) outputs the reinforcement voltage signal, but otherwise outputs the basic voltage signal.

As shown in FIG. 2, each word-line voltage control logic unit 50 that outputs the basic voltage signal or the reinforcement voltage signal includes a gate driver 59, a first switching transistor T1, a second switching transistor T2, a basic voltage source ($V_{dd}$) 61, and a reinforcement voltage source ($V_{dd}H$) 63.

The gate driver 59 outputs a high level voltage or a low level voltage according to whether or not the word line corresponding to each word-line voltage control logic unit 50 involves the cell where the access time failure occurs. For example, if it is determined through a previous test that the word line corresponding to each word-line voltage control logic unit 50 involves the cell where the access time failure occurs, the gate driver 59 outputs the high level voltage on the basis of a preset value of "1." On the other hand, if the word line does not involve the cell where the access time failure occurs, the gate driver 59 outputs the low level voltage on the basis of a preset value of "0."

Alternatively, the gate driver 59 may output the low level voltage on the basis of the preset value of "0" when the word line corresponding to each word-line voltage control logic unit 50 involves the cell where the access time failure occurs.

On the other hand, the gate driver 59 may output the high level voltage on the basis of the preset value of "1" when the word line does not involve the cell where the access time failure occurs.

If the word-line driver 20 connected to the output line 11 of one low decoder 10, the word-line voltage control logic unit 50 outputting the basic voltage signal or the reinforcement voltage signal to the word-line driver 20, and the word line activated by an output level voltage of the word-line driver 20 are regarded as one connection group, the word line corresponding to each word-line voltage control logic unit 50 indicates a word line that belongs to the same connection group of the word-line voltage control logic unit 50 (refer to FIG. 2).

That is, the word-line drivers 20 are connected to the respective output lines 11 of the row decoder 10, and the word-line voltage control logic units 50 are one-to-one connected to the respective word-line drivers 20 in order to supply the basic voltage signal or the reinforcement voltage signal to each word-line driver 20. When each word line activated or inactivated by the output level voltage of each word-line driver 20 is connected to the word-line driver 20, the word line corresponding to each word-line voltage control logic unit 50 is relevant to the word line activated or inactivated by each word-line driver 20.

The voltages output from the gate driver 59 are the preset values. For example, if the word line corresponding to the word-line voltage control logic unit 50 including the gate driver 59 involves the cell where the access time failure occurs, the gate driver 59 is previously set to generate and output the high (or low) level voltage. If the word line corresponding to the word-line voltage control logic unit 50 including the gate driver 59 does not involve the cell where the access time failure occurs, the gate driver 59 is previously set to generate and output the low (or high) level voltage.

That is, each gate driver 59 previously stores a value of "1" or "0" in one bit provided corresponding to each word line and generates and outputs the high level voltage or the low level voltage. Specifically, if the corresponding word line involves the cell having the access time failure, "1 (or 0)" is stored in a bit stream included in the gate driver 59. If the corresponding word line does not involve the cell having the access time failure, "0 (or 1)" is stored in a bit stream included in the gate driver 59. When "0 (or 1)" is stored, the gate driver 59 generates and outputs the low (or high) level voltage. When "1 (or 0)" is stored, the gate driver 59 generates and outputs the high (or low) level voltage.

The high level voltage generated and output by the gate driver 59 is input to a gate terminal of a transistor and sufficient to turn on/off the transistor.

In other words, the gate driver 59 previously stores a bit value of "0" or "1," and generates and outputs the low level voltage or the high level voltage as a voltage level corresponding to the bit value. Here, the high level voltage is input to the gate terminals of the first and second switching transistors and sufficient to turn on the first and second switching transistors.

The output level voltage (high or low level voltage) of the gate driver 59 is input to the gate terminals of the first switching transistor T1 and the second switching transistor T2. For reference, the output level voltages applied to the gate terminals of the first switching transistor T1 and the second switching transistor T2 are opposite to each other. For example, if the high (or low) level voltage is applied to the gate terminal of the first switching transistor T1, the low (or high) level voltage is applied to the gate terminal of the second switching transistor T2.

As shown in FIG. 2, the first switching transistor T1 includes the gate terminal connected to an output line 57 of the gate driver 59, a drain terminal connected to the basic voltage source ($V_{dd}$) 61, and a source terminal connected to the word-line driver 20.

Further, as shown n FIG. 2, the second switching transistor T2 includes the gate terminal connected to the output line 57 of the gate driver 59, to which an opposite level voltage to the level voltage input to the gate terminal of the first switching transistor T1 is input; a drain terminal connected to the reinforcement voltage source ($V_{dd}H$) 63; and a source terminal connected to the word-line driver 20.

Since the level voltage applied to the gate terminal of the first switching transistor T1 is opposite to the level voltage applied to the gate terminal of the second switching transistor T2, an inverter 51 is either connected between the gate driver 59 and the first switching transistor T1 or between the gate driver 59 and the second switching transistor T2.

That is, if the inverter is connected between the output line of the gate driver and the gate terminal of the first switching transistor, the output line of the gate driver is directly connected to the gate terminal of the second switching transistor. Alternatively, if the inverter is connected between the output line of the gate driver and the gate terminal of the second switching transistor, the output line of the gate driver is directly connected to the gate terminal of the first switching transistor.

In an embodiment referring to FIG. 2, the inverter 51 is connected only between the gate driver 59 and the first switching transistor T1.

With this configuration, the word-line voltage control logic unit 50 operates as follows. If the gate driver 59 generates and outputs the high (or low) level voltage, the first switching transistor T1 or the second transistor T2 is turned on to output the basic voltage signal or the reinforcement voltage signal to the word-line driver 20.

As shown in FIG. 2, if the inverter 51 is connected only between the gate driver 59 and the first switching transistor T1 and the gate driver 59 outputs the high level voltage, only the second switching transistor T2 is turned on to input the reinforcement voltage signal ($V_{dd}H$) to the word-line driver 20. On the other hand, if the inverter 51 is connected only between the gate driver 59 and the first switching transistor T1 and the gate driver 59 outputs the low level voltage, only the first switching transistor T1 is turned on to input the basic voltage signal ($V_{dd}$) to the word-line driver 20.

In this embodiment, the first switching transistor T1 and the second switching transistor T2 are achieved by an n-channel metal oxide semiconductor (NMOS) transistor. If the first switching transistor T1 and the second switching transistor T2 are achieved by a p-channel metal oxide semiconductor (PMOS) transistor, the inverter 51 is connected only between the gate driver 59 and the second switching transistor T2.

In the state that the first switching transistor T1 and the second switching transistor T2 are achieved by the PMOS transistor, if the inverter 51 is connected only between the gate driver 59 and the second switching transistor T2 and the gate driver 59 outputs the high level voltage, only the second switching transistor T2 is turned on to input the reinforcement voltage signal ($V_{dd}H$) to the word-line driver 20. On the other hand, if the gate driver 59 outputs the low level voltage, only the first switching transistor T1 is turned on to input the basic voltage signal ($V_{dd}$) to the word-line driver 20.

Thus, the basic voltage signal or the reinforcement voltage signal is output from the word-line voltage control logic unit 50 to the word-line driver 20. As shown in FIG. 2, the word-line drivers 20 are connected to the output lines 11 of the row decoder 10 one-to-one. Therefore, the number of word-line drivers 20 is provided as many as the number of output lines 11 of the row decoder 10.

The word-line driver 20 supplies the basic voltage signal or the reinforcement voltage signal from the word-line voltage control logic unit 50 to the corresponding word line only if the output signal from the output line of the row decoder 10 is an activation signal (i.e., a threshold voltage for turning on the transistor). Contrarily, if the output signal from the output line of the row decoder 10 is not an activation signal, the basic voltage signal or the reinforcement voltage signal output from the word-line voltage control logic unit 50 is not supplied to the corresponding word line. In this case, the corresponding word line is not activated.

As shown in FIG. 2, a detailed logic circuit of the word-line driver 20 includes four switching transistors T3, T4, T5 and T6.

Specifically, a third switching transistor T3 includes a gate terminal to which a signal output through the output line 11 of the row decoder 10 is inverted and input, and a drain terminal connected to the source terminals of the first and second switching transistors T1 and T2. Thus, the basic voltage signal or the reinforcement voltage signal output from the word-line voltage control logic unit 50 is input to the drain terminal of the third switching transistor T3.

The fourth switching transistor T4 includes a gate terminal to which a signal output through the output line 11 of the row decoder 10 is directly input, a drain terminal connected to a source terminal of the third switching transistor T3, and a source terminal connected to the ground.

The fifth switching transistor T5 includes a gate terminal to which a signal output through the source terminal of the third switching transistor T3 and the drain terminal of the fourth switching transistor T4 is inverted and input, a drain terminal connected to the source terminals of the first and second switching transistors T1 and T2, and a source terminal connected to the word line. Thus, the basic voltage signal or the reinforcement voltage signal output from the word-line voltage control logic unit 50 is input to the drain terminal of the fifth switching transistor T5.

The sixth switching transistor T6 includes a gate terminal to which a signal output through the source terminal of the third switching transistor T3 and the drain terminal of the fourth switching transistor T4 is directly input, a drain terminal connected to the source terminal of the fifth switching transistor T5 and the word line, and a source terminal connected to the ground.

With this configuration, the word-line driver 20 cannot supply the basic voltage signal or the reinforcement voltage signal from the word-line voltage control logic unit 50 to the corresponding word line if the signal input through the output line 11 of the row decoder 10 is an inactivation signal (a voltage signal having a level insufficient to turn on the transistor, i.e., a voltage signal having a lower level than the threshold voltage).

Specifically, when the inactivation signal (e.g., a voltage lower than the threshold voltage, i.e., less than 0.7V) is output through the output line 11 of the row decoder 10, only the third switching transistor T3 between the third switching transistor T3 and the fourth switching transistor T4, of which the gate terminal receives an inverted signal, is turned on. Then, the basic voltage signal or the reinforcement voltage signal is input from the word-line voltage control logic unit 50 to the fifth switching transistor T5 and the sixth switching transistor T6.

As described above, because the basic voltage signal or the reinforcement voltage signal has a level enough to turn on the transistor, only the sixth switching transistor T6, of which the gate terminal directly receives the basic voltage signal or the reinforcement voltage signal without inversion, is turned on. Then, the word line is not activated since the ground voltage is applied to the word line.

On the other hand, when the activation signal (e.g., a voltage equal to or higher than the threshold voltage, i.e., not less than 0.7V) is output through the output line 11 of the row decoder 10, only the fourth switching transistor T4 between the third switching transistor T3 and the fourth switching transistor T4, of which the gate terminal directly receives the activation signal, is turned on. Then, the basic voltage signal or the reinforcement voltage signal is not input from the word-line voltage control logic unit 50 to the fifth switching transistor T5 and the sixth switching transistor T6, and the ground voltage is applied to the fifth switching transistor T5 and the sixth switching transistor T6.

Thus, only the fifth switching transistor T5, of which the gate terminal receives a level voltage inverted from the ground voltage, is turned on. Then, the word line is activated since it receives the basic voltage signal or the reinforcement voltage signal through the drain terminal of the fifth switching transistor T5.

In the meantime, detailed operations of the foregoing cache memory are as follows. Assume that the gate driver 59 is set with "1" to generate and output the high level voltage if the word line corresponding to the word-line voltage control logic unit 50 involves the cell where the access time failure occurs, but is set with "0" to generate and output the low level voltage if the word line does not involve the cell having the access time failure. Further, assume that the inverter 51 is connected only between the gate driver 59 and the first switching transistor T1.

When accessing the word line that involves the cell having the access time failure, the gate driver 59 generates and outputs the high level voltage. Then, only the second switching transistor T2 is turned on, so that the word-line voltage control logic unit 50 outputs the reinforcement voltage signal.

On the contrary, when accessing the word line that does not involve the cell having the access time failure, the gate driver 59 generates and outputs the low level voltage. Then, only the first switching transistor T1 is turned on, so that the word-line voltage control logic unit 50 outputs the basic voltage signal.

Thus, the word-line voltage control logic unit 50 outputs a general word line voltage (basic voltage signal) when accessing the word line that does not involve the cell having the access time failure, but outputs a word line voltage (reinforcement voltage signal) higher than the general word line voltage (basic voltage signal) when accessing the word line that involves the cell having the access time failure.

The basic voltage signal or the reinforcement voltage signal output from the word-line voltage control logic unit 50 is input to the drain terminals of the third switching transistor T3 and the fifth switching transistor T5 provided in the word line driver 20.

The basic voltage signal or the reinforcement voltage signal is applied to the corresponding word line in response to operation of the word-line driver 20, thereby activating the corresponding word line. Specifically, the basic voltage signal or the reinforcement voltage signal is applied to and activates the corresponding word line only when a signal output through the output line 11 of the row decoder 10 is the activation signal.

For example, if the activation signal is output through the output line 11 of the row decoder 10, the third switching transistor T3 is not turned on but the fourth switching transistor T4 is turned on, so that the ground voltage is applied to the fifth switching transistor T5 and the sixth switching transistor T6. Then, the fifth switching transistor T5, of which the gate terminal receives the inverted ground voltage, is turned on, but the sixth switching transistor T6 is not turned on, so that the basic voltage signal or the reinforcement voltage signal input through the drain terminal of the fifth switching transistor T5 is applied to and activates the corresponding word line.

At this time, if the word line involves the cell having the access time failure, the word-line voltage control logic unit 50 outputs the reinforcement voltage signal to the word line, thereby activating the word line. In result, even the word line that involves the cell having the access time failure can be activated, thereby improving a yield of the cache memory.

If the word line does not involve the cell having the access time failure, the word-line voltage control logic unit 50 outputs the basic voltage signal to the word line, thereby activating the word line. In result, use of the reinforcement voltage signal is minimized, thereby preventing power from being more consumed than is necessary.

On the other hand, if the inactivation signal is output through the output line 11 of the row decoder 10, the ground voltage is applied to the word line since it is desired not to access the corresponding word line. Specifically, if the inactivation signal is output from the output line 11, the fourth switching transistor T4 is not turned on but the third switching transistor T3 is turned on, so that a voltage corresponding to the basic voltage signal or the reinforcement voltage signal is applied to the fifth switching transistor T5 and the sixth switching transistor T6. Then, the sixth switching transistor T6, of which the gate terminal directly receives the voltage corresponding to the basic voltage signal or the reinforcement voltage signal, is turned on, but the fifth switching transistor T5 is not turned on, so that the ground voltage is applied to and inactivates the corresponding word line.

According to the cache memory with the foregoing configuration and operations, the general word-line voltage signal (basic voltage signal) is applied when accessing the word line (cache line) that does not involve the cell where the access time failure occurs, and the reinforcement voltage signal having a higher level than the word-line voltage signal (basic voltage signal) is applied when accessing the word line (cache line) that involves the cell having the access time failure. Thus, the reinforcement voltage signal is applied when accessing the word line that involves the cell having the access time failure, thereby shortening an access time to the word line and increasing the yield of the cache memory.

As described above, there is provided a cache memory, in which a word-line voltage control logic unit and a word-line driver are added as a logic circuit between a row decoder and a word line, so that a reinforcement voltage signal having a higher level than a basic voltage signal can be applied when accessing the word line corresponding to an access time failure, thereby decreasing an access time delay in the word line in order to minimize an access failure to the cache memory due to process variation. Consequently, a yield of the cache memory increases.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A cache memory comprising:
    a row decoder which decodes and outputs an input address signal;
    a plurality of word-line voltage control logic units which output a basic voltage signal or a reinforcement voltage signal having a higher voltage level than the basic voltage signal according to whether or not word lines involve a cell having an access time failure; and
    word-line drivers which are one-to-one connected to output lines of the row decoder and supply the word lines with the basic voltage signal or the reinforcement voltage signal output from the word-line voltage control logic unit only if a signal output through the output line of the row decoder is an activation signal.

2. The cache memory according to claim 1, wherein the word-line voltage control logic unit comprises a gate driver which generates and outputs a high level voltage or a low level voltage according to whether or not the word lines involve the cell having the access time failure; a first switching transistor which comprises a gate terminal connected to an output line of the gate driver, a drain terminal connected to a basic voltage source, and a source terminal connected to the word-line driver; and a second switching transistor which comprises a gate terminal connected to the output line of the gate driver, to which a level voltage relevant to a level voltage input to the gate terminal of the first switching transistor is input, a drain terminal connected to a reinforcement voltage source, and a source terminal connected to the word-line driver.

3. The cache memory according to claim 2, wherein the output line of the gate driver and the gate terminal of the first switching transistor are connected to each other via an inverter, but the output line of the gate driver and the gate terminal of the second switching transistor are directly connected to each other.

4. The cache memory according to claim 2, wherein the output line of the gate driver and the gate terminal of the second switching transistor are connected to each other via an inverter, but the output line of the gate driver and the gate terminal of the first switching transistor are directly connected to each other.

5. The cache memory according to claim 2, wherein the first switching transistor and the second switching transistor comprise an n-channel metal oxide semiconductor (NMOS) or p-channel metal oxide semiconductor (PMOS) transistor.

6. The cache memory according to claim 2, wherein the gate driver previously stores a bit value of "0" or "1" and generates and outputs a low or high level voltage having a level corresponding to the bit value.

7. The cache memory according to claim 6, wherein the high level voltage is input to the gate terminals of the first and second switching transistors and sufficient to turn on the first and second switching transistors.

8. The cache memory according to claim 2, wherein the basic voltage source generates a basic voltage signal within a range of 0.7V to 0.9V to be applied to the drain terminal of the first switching transistor, and the reinforcement voltage source generates a reinforcement voltage signal within a range of 1V to 1.5V to be applied to the drain terminal of the second switching transistor.

9. The cache memory according to claim 2, wherein the word-line driver comprises
    a third switching transistor comprising a gate terminal to which a signal output through the output line of the row decoder is inverted and input, and a drain terminal connected to the source terminals of the first and second switching transistors;
    a fourth switching transistor comprising a gate terminal to which a signal output through the output line of the row decoder is input, a drain terminal connected to the source terminal of the third switching transistor, and a source terminal connected to a ground;

a fifth switching transistor comprising a gate terminal to which a signal output through the source terminal of the third switching transistor and the drain terminal of the fourth switching transistor is inverted and input, a drain terminal connected to the source terminals of the first and second switching transistors, and a source terminal connected to the word line; and a sixth switching transistor comprising a gate terminal to which a signal output through the source terminal of the third switching transistor and the drain terminal of the fourth switching transistor is input, a drain terminal connected to the source terminal of the fifth switching transistor and the word line, and a source terminal connected to the ground.

* * * * *